United States Patent
Ho et al.

[11] Patent Number: 6,086,774
[45] Date of Patent: Jul. 11, 2000

[54] METHOD OF MAKING RELEASED MICROMACHINED STRUCTURES BY DIRECTIONAL ETCHING

[75] Inventors: Francis Ho, Palo Alto; Yoshihisa Yamamoto, Stanford, both of Calif.

[73] Assignees: The Board of Trustees of the Stanford Leland Junior University, Palo Alto, Calif.; Japan Science and Technology Corporation, Japan

[21] Appl. No.: 08/993,924

[22] Filed: Dec. 18, 1997

[51] Int. Cl.[7] ............................. B44C 1/22; C25F 3/02; C25F 3/12; G01P 15/02
[52] U.S. Cl. .................... 216/11; 73/514.01; 73/514.36; 216/2; 216/41; 216/63; 216/65; 216/66; 216/67; 216/94; 437/225
[58] Field of Search ........................ 73/514.01, 514.36; 216/2, 11, 41, 63, 65, 66, 67, 94; 437/225

[56] References Cited

U.S. PATENT DOCUMENTS

| | | | |
|---|---|---|---|
| 4,309,267 | 1/1982 | Boyd et al. | 204/298 |
| 4,600,934 | 7/1986 | Aine et al. | 357/26 |
| 4,670,092 | 6/1987 | Motamedi | 156/643 |
| 5,426,070 | 6/1995 | Shaw et al. | 216/2 |
| 5,427,975 | 6/1995 | Sparks et al. | 437/79 |
| 5,573,679 | 11/1996 | Mitchell et al. | 216/2 |
| 5,594,166 | 1/1997 | Itoh et al. | 73/105 |
| 5,638,946 | 6/1997 | Zavracky | 200/181 |
| 5,846,849 | 12/1998 | Shaw et al. | 438/52 |
| 5,847,454 | 12/1998 | Shaw et al. | 257/734 |

*Primary Examiner*—Rabon Sergent
*Attorney, Agent, or Firm*—Lumen Intellectual Property Services

[57] ABSTRACT

A method of making released structures by using at least two directional etching steps. Cantilevers, bridges and many other structures can be made with the present invention. In a preferred embodiment, two directional etching steps are performed at opposing angles nonnormal to the substrate surface such that the substrate is undercut and a structure is released. Alternatively, more than two directional etching steps may be performed at various angles. For example, the substrate may be rotated continuously during the directional etching process. A cantilever formed by the method of the present invention necessarily has a substantially triangular cross section. Directional etching processes that can be used include focused ion beam etching and ECR plasma etching. Some directional etching processes may require the use of a patterned etch resist layer. Other etching processes such as focused ion beam etching may use scanning techniques to select which regions are etched. A backside etch can be performed to remove remaining substrate material under the released micromachined structure. The method is particularly well suited for making released cantilevers.

11 Claims, 8 Drawing Sheets

Fig. 8
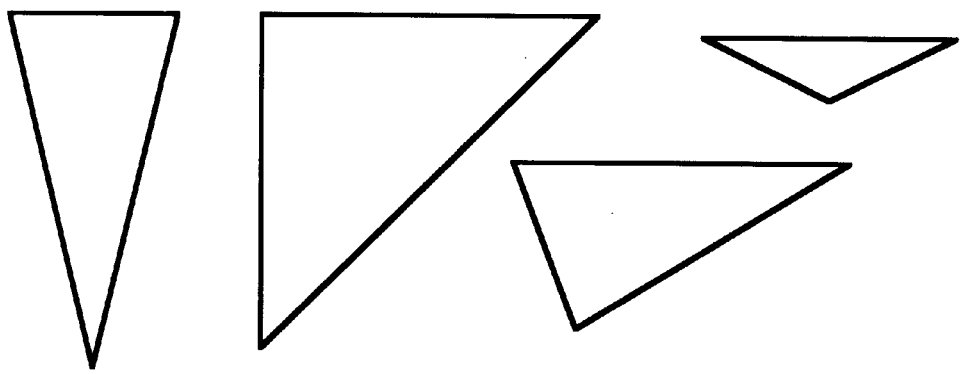
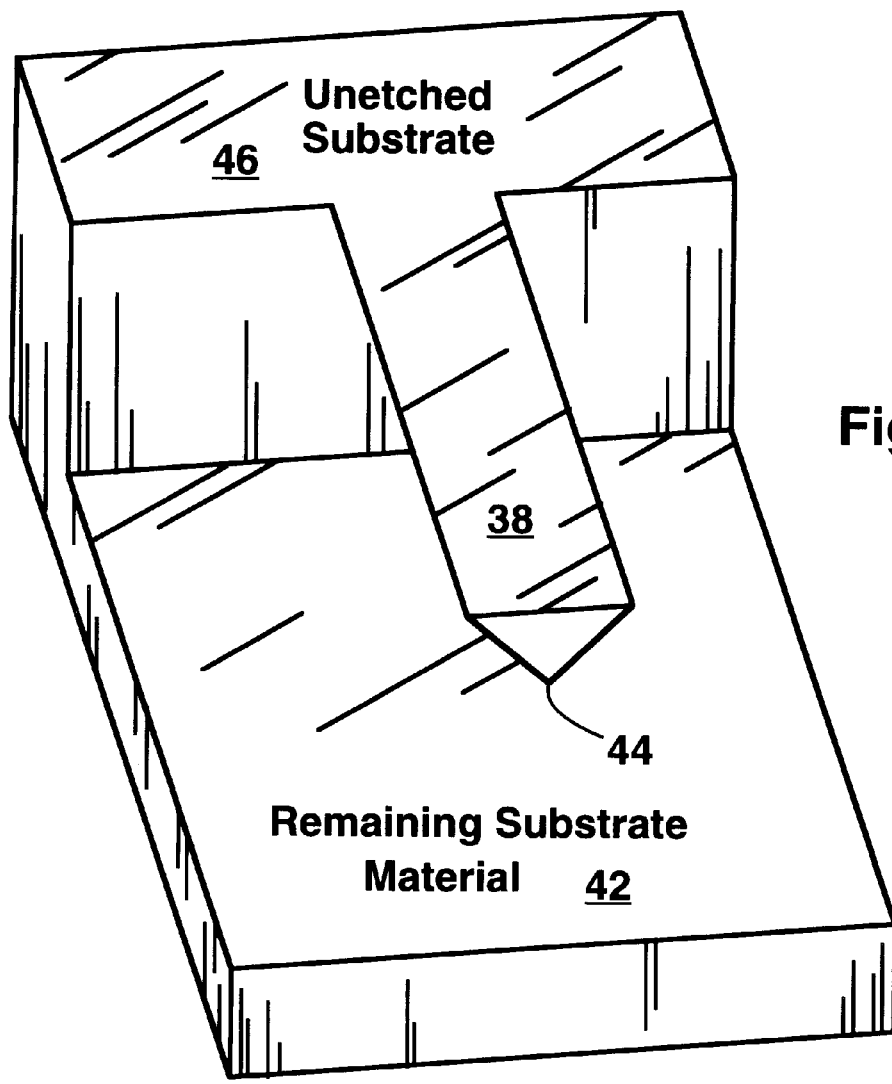
Fig. 9

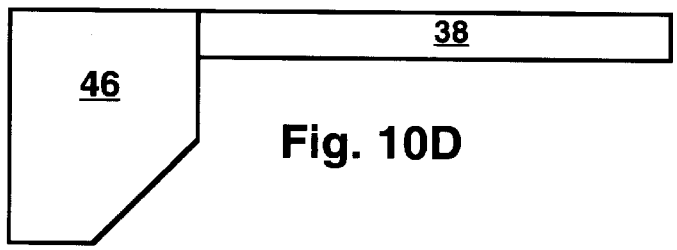
Fig. 10D
Fig. 12
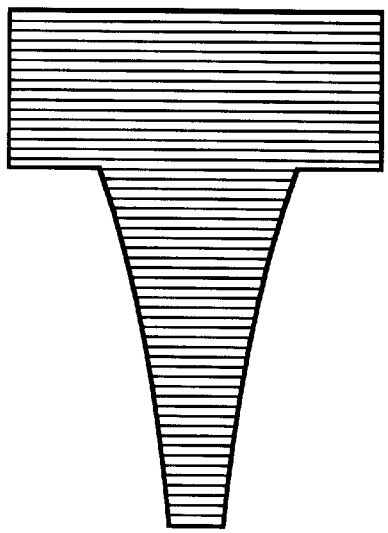
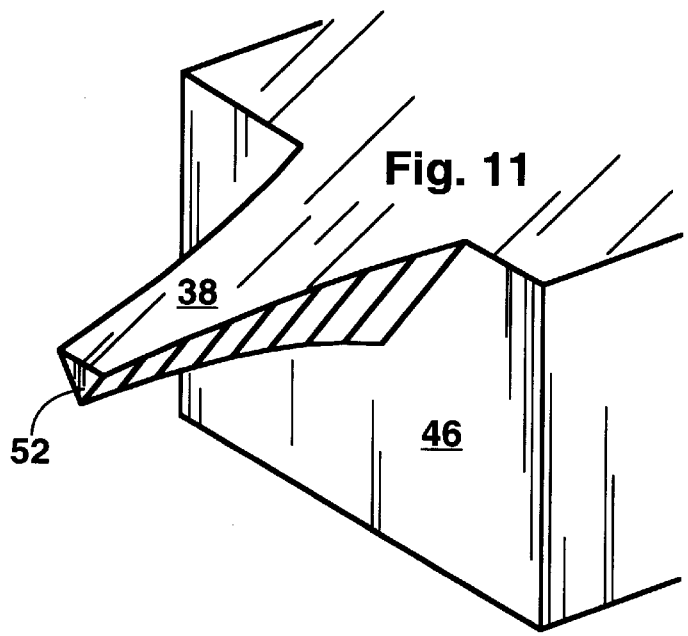
Fig. 11
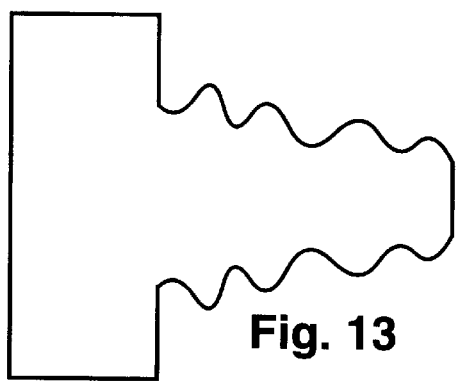
Fig. 13

6,086,774

METHOD OF MAKING RELEASED MICROMACHINED STRUCTURES BY DIRECTIONAL ETCHING

FIELD OF THE INVENTION

This invention relates to micromachined structures, and, more specifically, to released micromachined structures as used in accelerometers, atomic-force microscopy and the like.

BACKGROUND OF THE INVENTION

The use of released microstructures such as cantilevers is well known in the art of micromachined sensors and in the art of atomic force microscopy.

Cantilevers used in these applications often must be fabricated with precisely controlled lengths and other mechanical properties so that they can be used for accurate measurements. High quality (Q) factors and high vibration frequencies are often desirable, for example.

There exist several prior art techniques for fabricating cantilevers. One commonly used technique is shown in FIGS. 1–3. First, a T-shaped region of a substrate surface is doped with an impurity species as shown in FIG. 1. Silicon can be doped with boron, for example. The doped region is resistant to etching by certain chemical etchants. Etching away 20 the underlying, undoped material with a dopant-sensitive etchant results in a freestanding, doped cantilever 22 as shown in FIG. 2. A perspective view of the cantilever is shown in FIG. 3. The thickness of the cantilever is determined by the depth to which the dopant ions penetrated the original substrate.

The wide base region of the cantilever in FIG. 3 can be used to provide an accurate cantilever length by making it possible to determine the cantilever length by the length of the doped region, and not the final backside etch 20. However, this technique results in lower Q factor for the cantilever because it is not rigidly clamped at the base. The wide base region will flex somewhat, lowering the Q.

The thickness of the resultant cantilever is hard to control because the depth of dopant introduction is hard to control. High temperature processing steps, for example, can cause the dopant profile to change due to diffusion. It is important to be able to accurately control the cantilever thickness in order to produce cantilevers with desired mechanical properties. Also, it is difficult to dope shallow regions of a substrate surface, rendering the fabrication of thin cantilevers by the doping method problematic and inaccurate.

Another disadvantage with the above described technique is a result of the backside etch used to remove the substrate material. The distance of the backside etch illustrated in FIG. 2 determines the final length of the cantilever. In other words, the length of the cantilever depends on the location of the surface formed by the backside etch. This location depends on the exact conditions and duration of the etching process, and typically has an uncertainty of tens of microns. The length of the cantilever will thus be uncertain by this amount.

A further disadvantage of the above described technique is that the cantilever produced is necessarily highly doped. This doping precludes the fabrication of electronic devices on the cantilever. Electronic devices fabricated directly on the cantilever could be useful as transducers or actuators.

Another problem with some prior art techniques is that the cantilever formed has a flat bottom side. A flat bottom side is susceptible to sticking to the underlying substrate in devices which have an underlying substrate. Van der Waals forces cause the sticking and cannot be eliminated. When a cantilever sticks to the substrate, it is likely ruined. Sticking thus reduces the yield of functional devices.

Other cantilever fabrication techniques require the use of a starting substrate with a buried oxide layer to act as an etch stop. This can be a problem because such buried layer substrates are relatively expensive compared to substrates without a buried oxide layer.

U.S. Pat. No. 5,594,166 to Itoh et. al. describes a method of making a silicon dioxide cantilever. This invention uses an anisotropic KOH etch to release a silicon dioxide cantilever from the underlying silicon substrate. Since the release etch step is anisotropic with respect to the crystal planes of silicon, the original substrate must be properly oriented with respect to the cantilever produced. Also, since the cantilever must be made of silicon dioxide, an insulating material, the possibilities for fabricating semiconductor electronic devices on the cantilever are reduced. Further, since the release step is performed with a wet chemical etchant, the length of the cantilever is rather imprecise.

U.S. Pat. No. 4,670,092 to Motamedi describes a technique for making a cantilever for use as an accelerometer. The method uses a backside anisotropic etch to remove material in the shape of a triangular slot. The cantilever is released in a separate, second step of cutting slots through the remaining oxide layer on the front surface. This method requires the use of wet chemical etchants and thus suffers from the mechanical inaccuracies inherent in using these etchants. This method requires the starting substrate to have a predetermined crystal orientation. The angle of the anisotropic etching is determined by the crystal structure and therefore cannot be changed. Thus, it is not possible to control the cross sectional geometry of the cantilever produced by this method. Further, this method produces a cantilever that has a thickness equal to the thickness of the original silicon wafer, and therefore cannot be used to make very thin cantilevers.

U.S. Pat. No. 4,600,934 to Aine et. al. describes a method for producing freestanding structures by means of anisotropic undercut etching. An etch resistant layer is deposited on the surface of a substrate and notches are provided in this layer. The notches are linear and the angle of the notches with respect to the crystal planes determines the rate of undercut etching. It is difficult to make thin, single crystal cantilevers with this invention because it is difficult to make thin, doped etch stopped layers. Furthermore, the method precludes the fabrication of electronic devices on the cantilever.

Therefore, there exists a need for a method of producing freestanding cantilever structures which can fabricate cantilevers with accurate dimensions, does not preclude the inclusion of electronic components on the cantilever, can produce cantilevers with a variety of controllable shapes, does not require the use of expensive buried oxide substrates, and produces cantilevers resistant to sticking problems.

OBJECTS AND ADVANTAGES OF THE INVENTION

Accordingly, it is an object of the present invention to provide a method of fabricating freestanding cantilever structures that:

1) can produce cantilevers with precisely controlled lengths, widths and cross sections,
2) does not require the use of expensive buried layer substrates, 3) does not preclude the fabrication of electronic devices on the cantilever,
4) can produce cantilevers with a variety of cross sectional (triangular) shapes,
5) can make cantilevers from single crystal silicon or other single crystal materials,
6) has greatly reduced sticking problems.

SUMMARY OF THE INVENTION

These objects and advantages are attained by performing a plurality of directional etching steps on a substrate. The etching steps are performed at a nonnormal angle to the substrate surface such that the etch undercuts the substrate surface. In a preferred embodiment of the present invention, two etching steps are performed at opposing angles. The etching angles and etching depths are selected such that the etched regions completely undercut and release a region of the substrate. The region released may, for example, be a linear cantilever, a curved beam, a beam with a mass on the end or a bridge joining two substrate pedestals. The released structures formed by the present method will have a triangular cross section. Varying the angle of the directional etch will change the cross sectional shape of the structure.

The etching process may employ a patterned etch resist layer to select which regions of the substrate are exposed to the directional etch. Etches which require a patterned etch resist layer include electron cyclotron (ECR) plasma etching and reactive ion etching.

Alternatively, the directional etching process may be performed with a scanned beam etching technique that does not require a patterned etch resist. Examples of such processes include focused ion beam etching and laser micromachining. These techniques do not require a patterned etch resist because the etched region can be selected by scanning the laser beam or ion beam.

Remaining, unetched substrate material under the released structure can be removed by protecting the structure with etch resist and exposing the reverse side of the substrate to a backside etch.

The present invention is capable of forming cantilevers of accurate length because the length is determined by the original patterned etch resist layer. Thus, the precision of the cantilever length is equal to the precision of the original etch resist pattern length. In the case of a focused etching technique, the shape and accuracy of the cantilever will be determined by the scanning of the etching beam (laser beam or ion beam).

Also, the present invention can be used on any material that can be etched directionally, such as silicon. The present invention does not require any doping steps. Further, the present invention can form cantilevers from homogeneous substrates which do not have a buried layer.

BRIEF DESCRIPTION OF THE FIGURES

FIG. 8 shows a variety of cross sectional shapes possible with the present invention.

FIG. 9 shows a perspective view of a released cantilever made according to the present invention.

FIGS. 10A–10D illustrate a method of removing the remaining substrate material under the cantilever.

FIG. 11 is a perspective view of a tapered cantilever which can be made with the present invention.

FIG. 12 is the mask pattern used to create the tapered cantilever of FIG. 11.

FIG. 13 is a mask pattern which can be used to create a cantilever with an undulating cross section.

DETAILED DESCRIPTION

Figure 1:
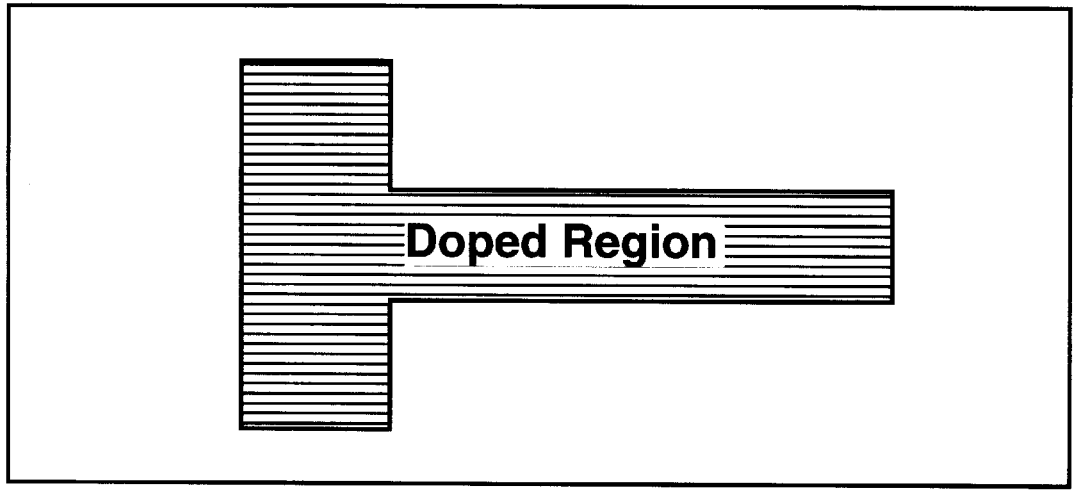
FIGS. 1–3 illustrate a prior art method of making free-standing cantilevers.
Figure 2:
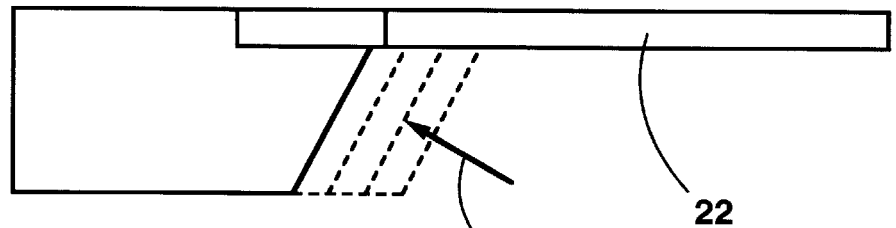
Figure 3:
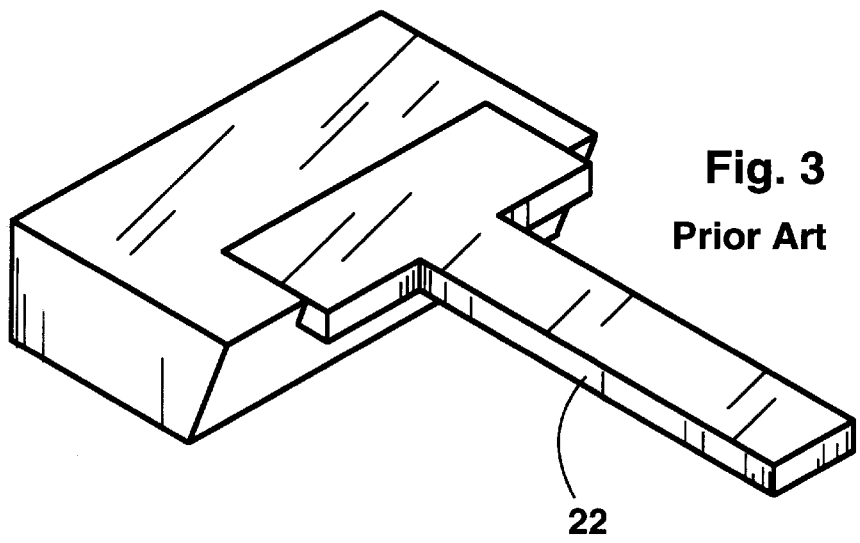
Figure 4:
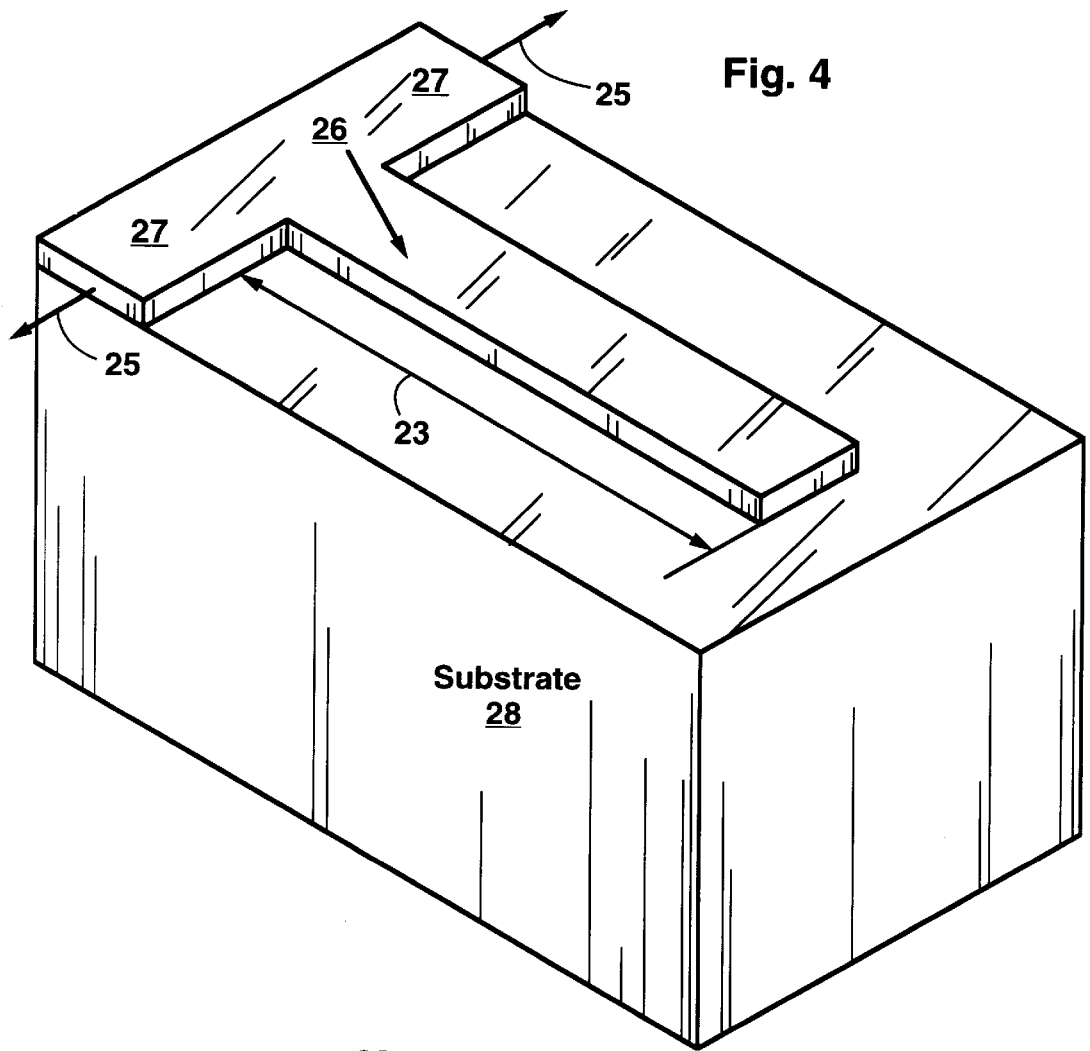
FIG. 4 illustrates a patterned resist layer as can be used in the present invention.

The first step in the method of the present invention is shown in FIG. 4. Here, a patterned etch resist layer 26 is deposited on the surface of a substrate 28. The patterned resist layer defines the shape of the cantilever formed. The length of the cantilever to be formed is indicated by arrow 23. It is noted that the base portion 27 of the patterned etch resist layer and the substrate 28 extend in the direction of the arrows 25. The substrate 28 can be single crystal pure or doped silicon or any other material that is amenable to directional etching. The etch resist layer 26 must be made of a material that is somewhat resistant to the directional etching processes used.

Figure 5:
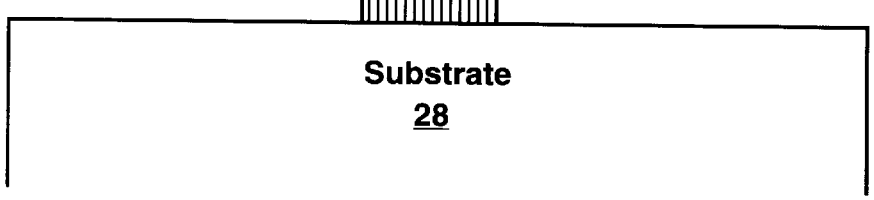
FIG. 5 is a cross sectional side view of the object of FIG. 4.

A front cross sectional view of the substrate 28 and patterned resist layer 26 is shown in FIG. 5.

Figure 6:
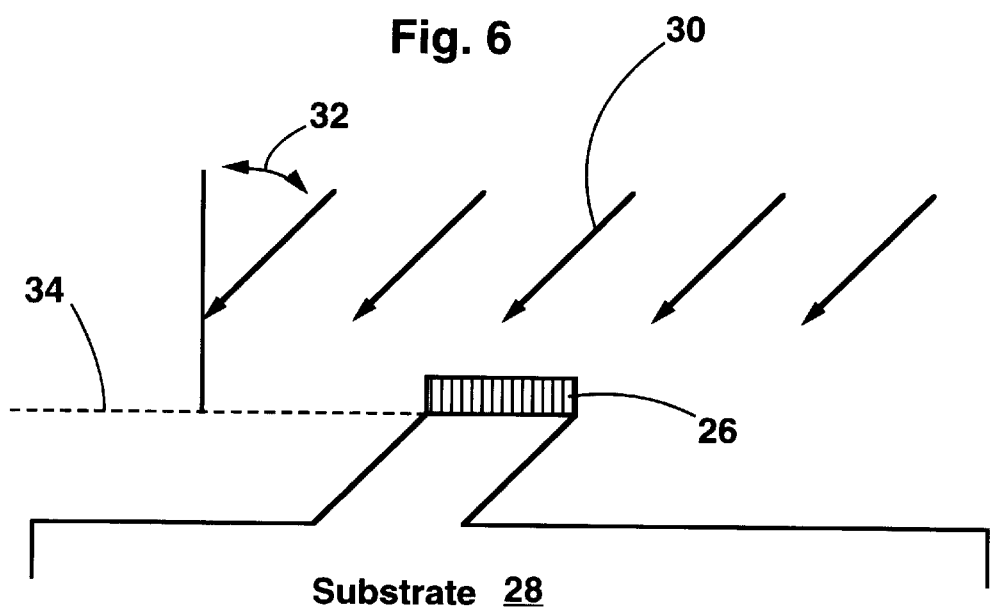
FIG. 6 is a side view of a first directional etching step used in the present invention.

A front cross sectional view of the first step of the present invention is shown in FIG. 6. Here, a directional etch 30 is used at an angle 32 nonnormal to the original substrate surface 34 to partially undercut the region of the substrate 28 protected by the patterned etch resist 26. The direction of the etch 30 is also preferably perpendicular to the length 23 of the cantilever to be formed.

The etching process used in the present invention is necessarily highly directional. Examples of possible etching techniques include reactive ion etching, or electron cyclotron resonance plasma etching. Such directional etching techniques are well known in the art of micromachining. More generally, any directional plasma etching process can be used. The etching can be performed at an angle 32 by orienting the substrate 28 at an angle to the plasma source. It will be obvious to one skilled in the art of micromachining how to perform the directional etching step at an angle 32 sufficient to be useful in the present invention. The best directional etching technique to us e will depend upon the substrate material, desired etching depth, desired etching speed, and possibly other variables. It will be obvious to one skilled in the art of micromachining how to select a directional etching technique appropriate for a particular application.

Figure 7:
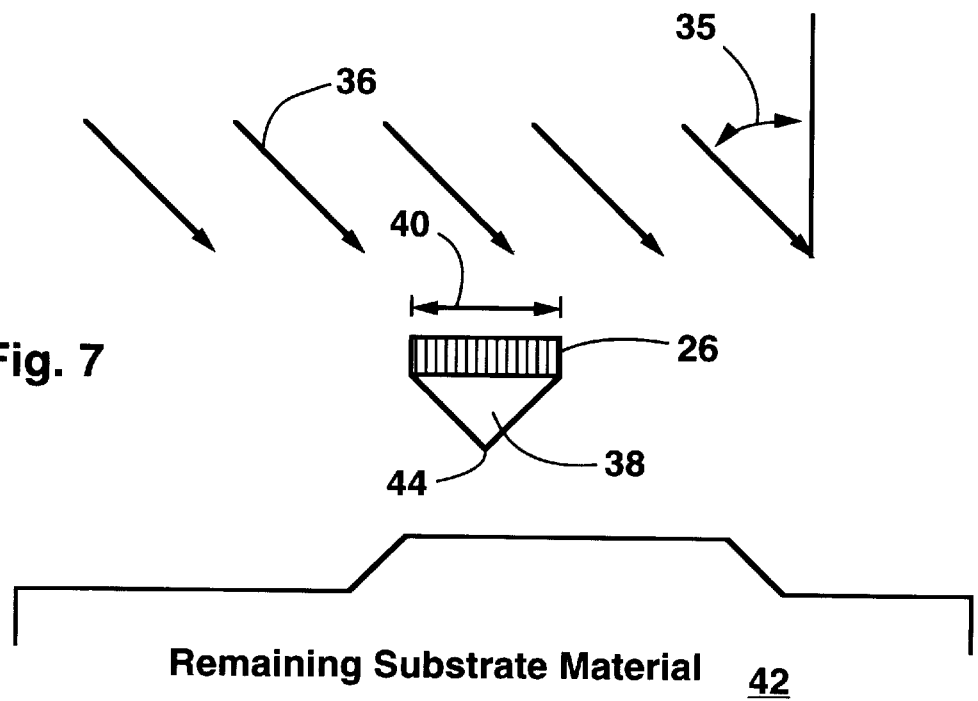
FIG. 7 is a side view of a second directional etching step used in the present invention.

The first etching step 30 shown in FIG. 6 is followed by a second directional etching step 36 shown in FIG. 7. The second etching step 36 is performed at an opposing angle 35 to the first, undercutting and releasing the cantilever 38. It is noted that the length of the cantilever 38 is the same as the length 23 of the original patterned resist layer 26. Thus, a cantilever 38 made according to the present invention has an accurately determined length 23. For the same reasons, the cantilever 38 has an accurately determined width 40. The released cantilever 38 is suspended above remaining substrate material 42 because the directional etching processes 30, 36 used typically will n ot etch through the entire substrate 28 thickness. After the second directional etching step, the patterned etch resist 26 can be removed.

The first 30 and second 36 directional etching steps can be performed at the same or different angles 32, 35 to form cantilevers of varied cross sectional triangular shapes. FIGS. 6 and 7, for example, show both etching steps being performed at a 45 degree angle. Also, it is possible to perform one etching step at an angle normal to the substrate surface 34 provided that the other etching step undercuts the patterned resist layer to a depth sufficient to release the cantilever 38. FIG. 8 shows a variety of cross sectional cantilever shapes that can be formed by the method of the present invention by using different etching angles. The angles 32, 35 for the first and second etching steps are limited by the capabilities of the directional etching process used. Etching angles close to 90 degrees (parallel to the substrate surface 34), for example, are typically not possible with directional etching processes.

It is noted that if a scanned beam directional etching technique is used, then the patterned etch resist layer 26 is not necessary. This is because the scanned etching beam only etches a small region of the substrate at a given time. Examples of scanned beam directional etching techniques include focused ion beam etching and laser micromachining. The best scanned etching technique to use will depend upon the substrate material, desired etching depth, desired etching speed, and possibly other parameters. It will be obvious to one skilled in the art of micromachining how to select a scanned etching technique appropriate for a particular application.

FIG. 9 shows a perspective view of the released cantilever 38 after the first and second etching steps and after the patterned etch resist 26 is removed. The cantilever 38 shown in FIG. 9 is supported by a pedestal of unetched substrate 46. The substrate pedestal 46 is not undercut by the directional etching steps of FIGS. 6 and 7 because the base portion 27 of the patterned etch resist 26 extends far away from the cantilever 38, as illustrated in FIG. 4.

Cantilevers 38 made according to the present invention necessarily have a triangular cross section with a vertex 44 on the bottom side. This feature reduces problems caused by sticking because the sticking forces between vertex 44 and the remaining substrate 42 are small due to the small surface area of contact.

Figure 10A:
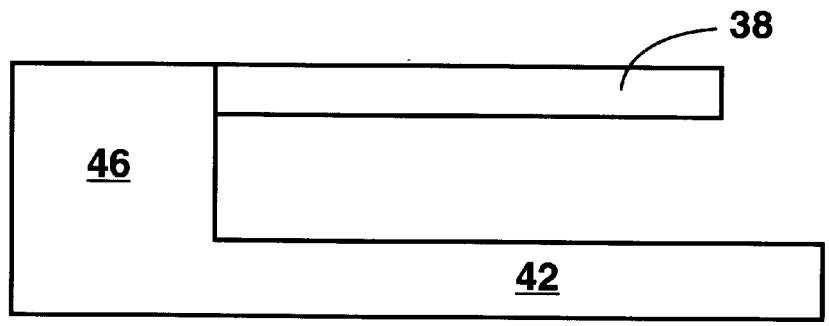
Figure 10B:
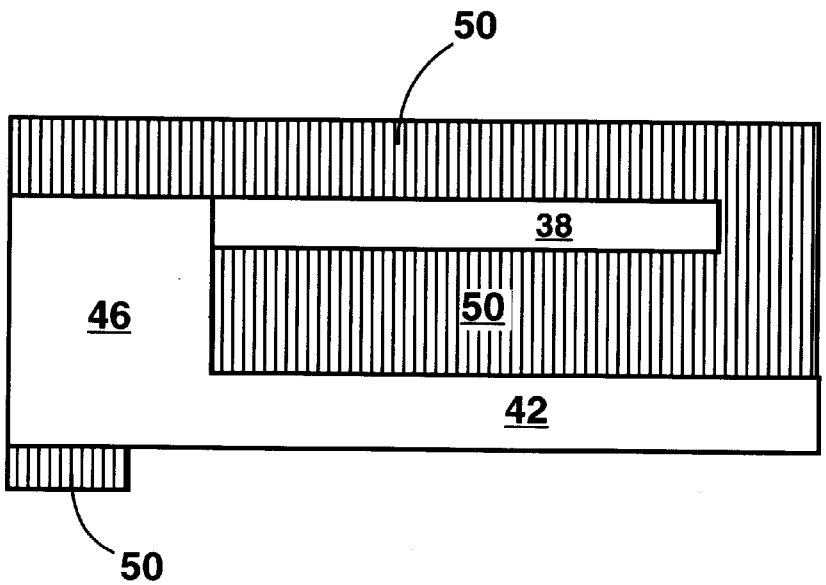
Figure 10C:
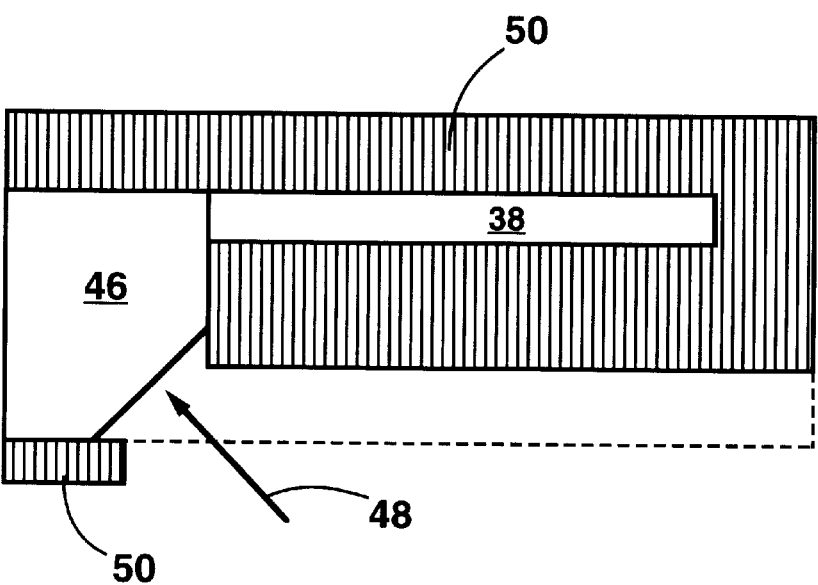

For many cantilever applications it is desirable to remove the remaining substrate material 42 under the cantilever 38. A process for removing this material is shown in FIGS. 10A–10D. FIG. 10A shows a side view of the released cantilever 38. As shown in FIG. 10B, the cantilever 38, top of the substrate pedestal 46, and portions of the bottom of the substrate pedestal 46 are covered with a protective etch resist layer 50. Next, the remaining substrate material 42 is exposed to a backside etch 48 as shown in FIG. 10C. The backside etch 48 can be performed with a wet chemical etchant. The backside etch step removes the remaining substrate material 42. It is important to note that the length of the cantilever 38 is not determined by the edge formed by the final backside etch step 48 of FIG. 10C. The backside etch does not progress far enough to remove material at the junction between the cantilever 38 and substrate pedestal 46. This does not require accurate timing of the backside etch duration. In a final step, the protective etch resist layer 50 is removed, uncovering the released cantilever 38 as shown in FIG. 10D.

The present invention can be used to make cantilevers 38 with a tapered cross section. Such a cantilever 38 with the free end 52 having a reduced cross section is shown in FIG. 11. The cantilever 38 of FIG. 11 can be made using the mask shown in FIG. 12. Of course, cantilevers with wider free ends, or undulating cross sections can be made using the present invention. FIG. 13 shows an etch resist mask pattern that will produce a cantilever with an undulating cross section.

Since the cantilever made according to the present invention does not need to be doped, electronic devices such as transducers can be fabricated on the cantilever. This can be done before or after the cantilever 38 is formed. It will be obvious to one skilled in the art of integrated circuit manufacturing how to fabricate electronic devices on the cantilever 38.

Figure 14:
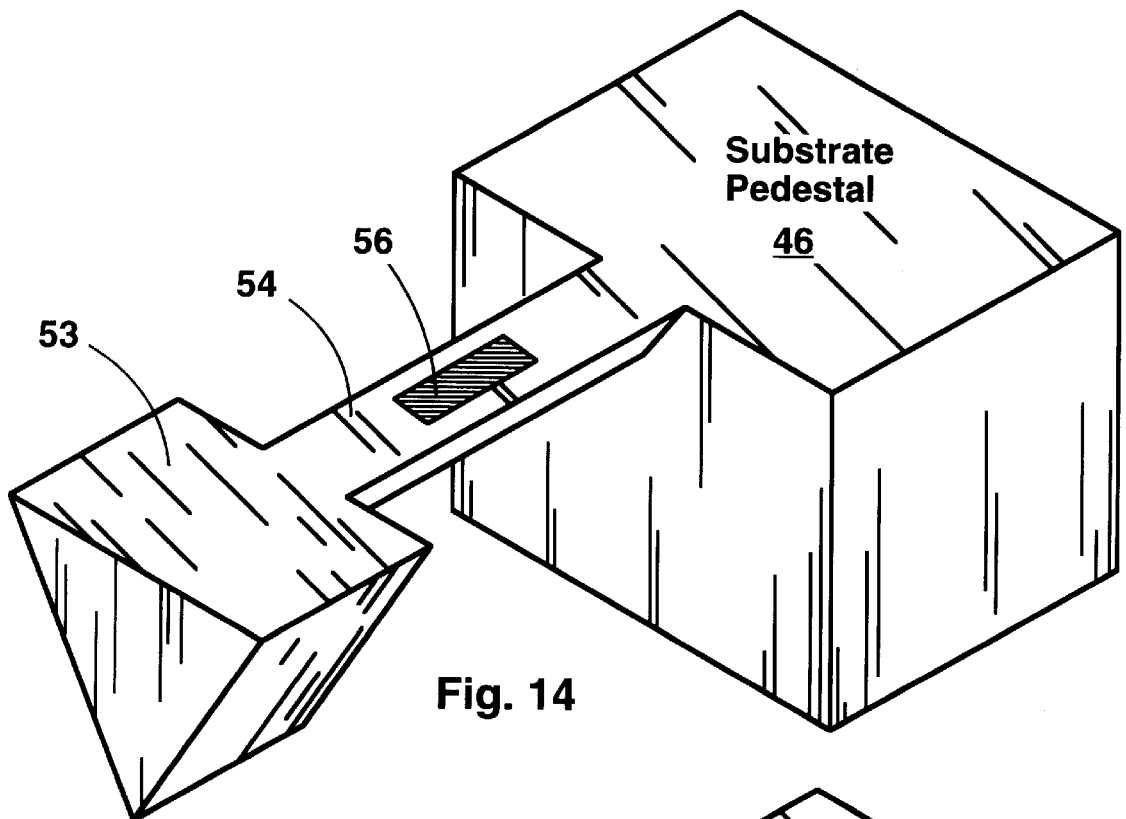
FIG. 14 is an isometric view of a cantilever with a mass on the free end as can be used as an accelerometer.

FIG. 14 shows an accelerometer which can be made by the present invention. A triangular mass 53 is supported on the free end of a cantilever 54. Both the triangular mass 53 and cantilever 54 can be fabricated in a single step. The triangular mass 53 will exert an inertial bending force on the cantilever 54 when the device experiences acceleration. Piezoelectric or piezoresistive transducers 56, for example, can be mounted on the cantilever 54 to measure the amount of bending and therefore the acceleration.

Figure 15:
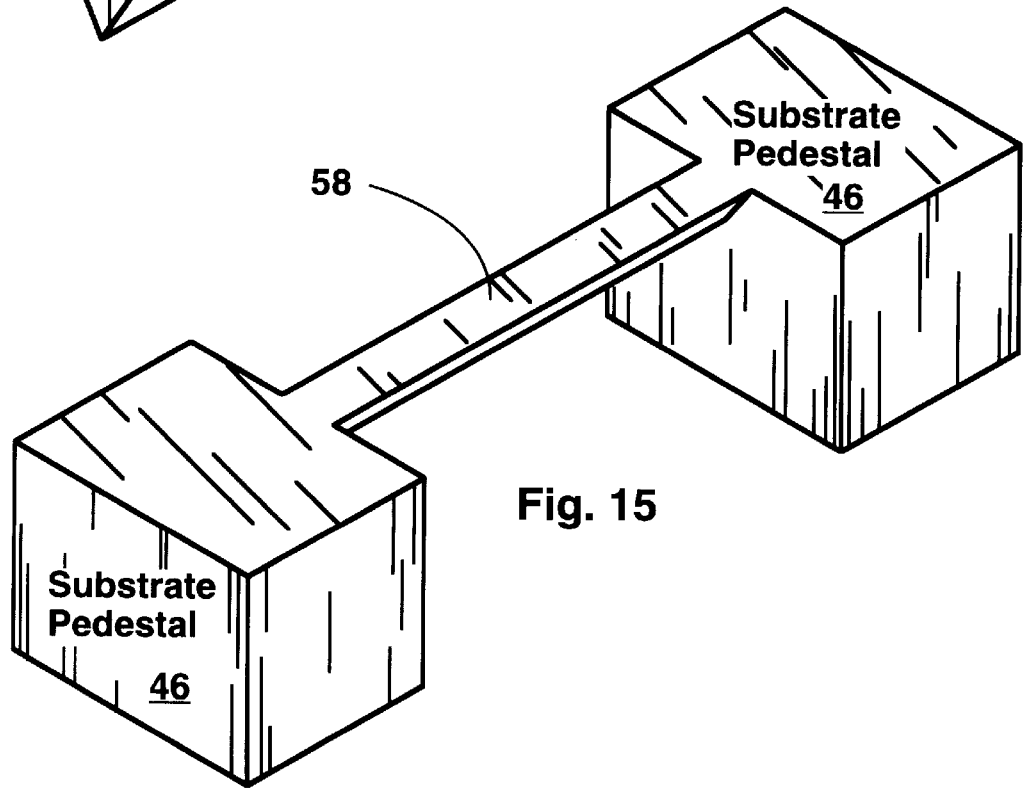
FIG. 15 shows a bridge structure which can be made with the present invention.

FIG. 15 shows a bridge structure 58 which can be made by the present invention. Two substrate pedestals 46 support the bridge 58, which has a triangular cross section.

Figure 16:
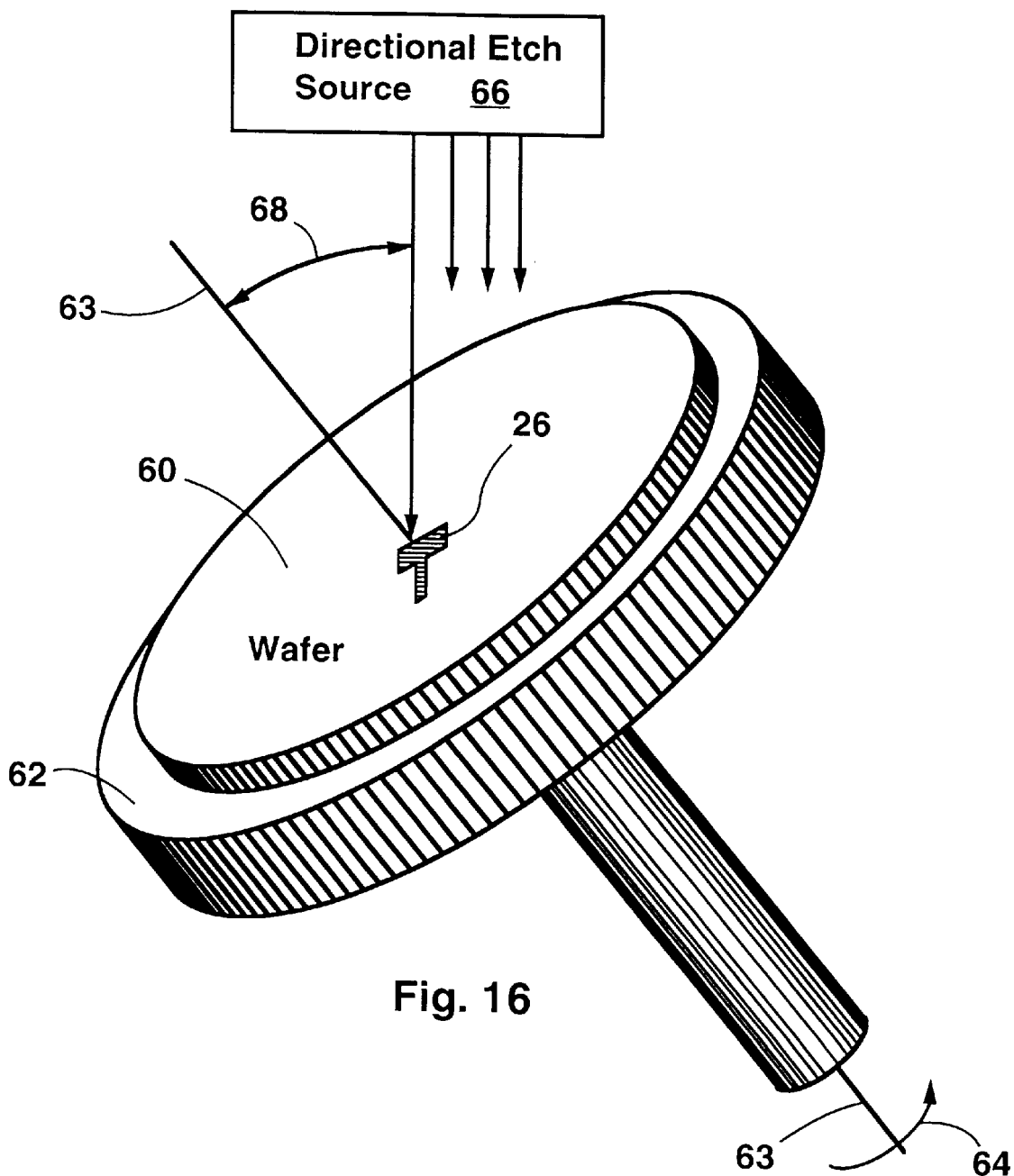
FIG. 16 shows how a wafer can be rotated during the angled directional etching process to perform the etching at a range of angles, thus releasing the desired structures.

FIG. 16 shows a possible method of performing the multiple angled directional etching steps used in the present invention. A wafer (same as the substrate 28) 60 is mounted on a platform 62 which can be rotated about an axis 63 in the direction shown by the arrow 64. The wafer 60 is exposed to a directional etching source 66 such as an ECR plasma source. In the case of nonscanning etching processes, the wafer 60 has patterned etch resist regions 26 on its surface. The wafer 60 is rotated as the directional etching is performed. Since the etching is performed at an angle 68 to the wafer surface, the patterned resist regions 26 are undercut. The wafer 60 may be rotated in discrete steps, or may be rotated continuously as the angled directional etching is performed. Continuous rotation during etching will result in a slight change in the shape of a cantilever on the free end, and will tend to undercut any substrate pedestal 46 which supports a released structure. Such subtleties will be obvious to one skilled in the art of directional etching techniques and micromachining. Continuous rotation during etching may be considered to be equivalent to using an infinite number of angled etching steps. By rotatably mounting the wafer 60, many different etching directions can be efficiently used.

The angled, rotating wafer embodiment of the present invention is more compatible with masked directional etching processes compared to scanned directional etching processes It will be clear to one skilled in the art that the above embodiment may be altered in many ways without departing from the scope of the invention. Accordingly, the scope of the invention should be determined by the following claims and their legal equivalents.

What is claimed is:

1. A method of making a released micromachined structure, said method comprising the step of:

A) performing a plurality of directional etching steps on first regions of a substrate such that at least one second region adjacent to said first regions is released from said substrate by means of being undercut by said directional etching steps;

wherein at least one of said directional etching steps is performed at an angle nonnormal to the surface of said substrate.

2. The method of claim 1 further comprising the step of forming a patterned etch resist layer on said substrate which exposes said first regions of said substrate.

3. The method of claim 1 wherein said directional etching steps are performed by directional plasma etching.

4. The method of claim 1 wherein said directional etching steps are performed by a technique selected from the group consisting of focused ion beam etching and laser micromachining.

5. The method of claim 1 further comprising the step of a backside etch to remove remaining substrate material under said released micromachined structure.

6. The method of claim 1 wherein said released micromachined structure is selected from the group consisting of cantilevers and bridges.

7. The method of claim 1 wherein said released micromachined structure has a nonuniform width.

8. A method of making are leased micromachined structure, said method comprising the step of:

A) performing a directional etching operation on first regions of a substrate such that at least one second region adjacent to said first regions is released from said substrate by means of being undercut by said directional etching operation;

wherein said directional etching operation is performed at an angle nonnormal to the surface of said substrate.

9. The method of claim 8 wherein said substrate is rotated in discrete steps during said directional etching operation.

10. The method of claim 8 wherein said substrate is rotated continuously during said directional etching operation.

11. An accelerometer made according to the method of claim 1 wherein said accelerometer comprises a mass supported on the end of a flexible triangular cantilever.

* * * * *